(12) United States Patent
Guo et al.

(10) Patent No.: US 12,338,378 B2
(45) Date of Patent: Jun. 24, 2025

(54) COMPOSITE MATERIAL, QUANTUM DOT LIGHT-EMITTING DIODE AND PREPARATION METHOD THEREOF

(71) Applicant: TCL TECHNOLOGY GROUP CORPORATION, Guangdong (CN)

(72) Inventors: Yulin Guo, Huizhou (CN); Longjia Wu, Huizhou (CN); Tianshuo Zhang, Huizhou (CN); Junjie Li, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 600 days.

(21) Appl. No.: 17/850,388

(22) Filed: Jun. 27, 2022

(65) Prior Publication Data

US 2022/0328781 A1    Oct. 13, 2022

Related U.S. Application Data

(63) Continuation of application No. PCT/CN2020/138765, filed on Dec. 24, 2020.

(30) Foreign Application Priority Data

Dec. 31, 2019 (CN) .......................... 201911409085.8

(51) Int. Cl.
*H10K 50/115* (2023.01)
*C01G 9/02* (2006.01)
(Continued)

(52) U.S. Cl.
CPC .............. *C09K 11/54* (2013.01); *C01G 9/02* (2013.01); *C01G 9/08* (2013.01); *C09K 11/02* (2013.01);
(Continued)

(58) Field of Classification Search
CPC . C01G 9/02; C01G 9/08; C09K 11/54; C09K 11/56; C09K 11/584; H10K 50/115; H10K 50/16
See application file for complete search history.

(56) References Cited

FOREIGN PATENT DOCUMENTS

| CN | 102473800 A | 5/2012 |
|---|---|---|
| CN | 102664129 A | 9/2012 |

(Continued)

OTHER PUBLICATIONS

Ma et al., "Au decorated hollow ZnO@ZnS heterostructure for enhanced photocatalytic hydrogen evolution: The insight into the roles of hollow channel and Au nanoparticles", Applied Catalysis B: Environmental, vol. 244, pp. 748-757. Available online Dec. 4, 2018. (Year: 2018).*

(Continued)

*Primary Examiner* — Daniel P Shook
(74) *Attorney, Agent, or Firm* — Maier & Maier, PLLC

(57) ABSTRACT

A composite material, quantum dot light-emitting diode and preparation method thereof. The preparation method includes: providing ZnO nanoparticles and Au source, Au source is at least one of bulk Au or Au particles; mixing ZnO nanoparticles, Au source, S source with first organic solvent, performing hydrothermal reaction to prepare composite material. By performing hydrothermal reaction in organic solvent using ZnO nanoparticles, bulk Au and/or Au particles, and S source, S source can vulcanize surface of ZnO nanoparticles to form ZnS layer on surface of ZnO nanoparticles, Au source can be thermally dissolved and diffused into isolated distribution of atomic-level Au to realize loading on surface of ZnS layer, to obtain composite material with ZnO nanoparticles as core material, ZnS and Au as (Continued)

shell material. ZnS and Au in composite material can synergistically increase electron transmission efficiency of LED adopting same.

20 Claims, 1 Drawing Sheet

(51) Int. Cl.
    *C01G 9/08*     (2006.01)
    *C09K 11/02*     (2006.01)
    *C09K 11/54*     (2006.01)
    *C09K 11/56*     (2006.01)
    *C09K 11/58*     (2006.01)
    *H10K 50/16*     (2023.01)
    *H10K 71/00*     (2023.01)
    *H10K 85/00*     (2023.01)
    *H10K 102/00*     (2023.01)
(52) U.S. Cl.
    CPC ............ *C09K 11/565* (2013.01); *C09K 11/58* (2013.01); *H10K 50/115* (2023.02); *H10K 50/16* (2023.02); *H10K 71/00* (2023.02); *H10K 85/00* (2023.02); *H10K 2102/331* (2023.02)

(56) References Cited

FOREIGN PATENT DOCUMENTS

| | | |
|---|---|---|
| CN | 106025084 A | 10/2016 |
| CN | 107673397 A | 2/2018 |
| CN | 207250548 U | 4/2018 |
| CN | 109935733 A | 6/2019 |
| KR | 10-2012-0038472 A | 4/2012 |
| WO | 2021136043 A1 | 7/2021 |

OTHER PUBLICATIONS

Chen et al., "L-Cysteine-Assisted Growth of Core-Satellite ZnS—Au Nanoassemblies with High Photocatalytic Efficiency" Langmuir 2010, 26, 8, 5918-5925. Dec. 9, 2009 (Year: 2009).*
International Search Report mailed Mar. 24, 2021, in corresponding International Application No. PCT/CN2020/138765, 8 pages (with English Translation).
First Office Action issued Nov. 17, 2021, in corresponding to Chinese Application No. 201911409085.8; pages (with English Translation).
Dandan Ma et al.; "Au decorated hollow ZnO@ZnS heterostructure for enhanced photocatalytic hydrogen evolution: The insight into the roles of hollow channel and Au nanoparticles"; Applied Catalysis B: Environmental; vol. 244; Dec. 4, 2018 (Dec. 4, 2018); DOI: https://doi.org/10.1016/j.apcatb.2018.12.016; pp. 748-757.
Wei-Ta Chen et al.; "L-Cysteine—Assisted growth of core-satellite ZnS—Au nanoassemblies with High Photocatalytic Efficiency"; Langmuir 2010; American Chemical Society; vol. 26; No. 8; Sep. 12, 2009 (Sep. 12, 2009); DOI: 10.1021/la904389y; pp. 5918-5925.
Puttaswamy Madhusudan et al.; "Nature inspired ZnO/ZnS nanobranch-like composites, decorated with Cu(OH) 2 clusters for enhanced visible-light photocatalytic hydrogen evolution"; Applied Catalysis B: Environmental; vol. 253; Apr. 13, 2019 (Apr. 13, 2019); DOI: https://doi.org/doi:10.1016/j.apcatb.2019.04.008; pp. 379-390.

* cited by examiner

COMPOSITE MATERIAL, QUANTUM DOT LIGHT-EMITTING DIODE AND PREPARATION METHOD THEREOF

CROSS-REFERENCES TO RELATED APPLICATIONS

The present application is a national stage application of PCT Patent Application No. PCT/CN2020/138765, filed on Dec. 24, 2020, which claims priority to Chinese Patent Application No. 201911409085.8, filed on Dec. 31, 2019, the content of all of which is incorporated herein by reference.

FIELD

The present application relates to the technical field of displaying, in particular to a composite material, a quantum dot light-emitting diode and a preparation method thereof.

BACKGROUND

ZnO is an n-type semiconductor material in group II-VI with a direct wide band gap, having a wide band of 3.37 eV and a low work function of 3.7 eV, as well as a plurality of advantages including a good stability, a high transparency, being safe and non-toxic, that makes the ZnO able to become a suitable material for an electron transport layer. ZnO has further a plurality of potential advantages: having an exciton binding energy as high as 60 meV, which is much higher than a plurality of other semiconductor materials with a wide band (25 meV for GaN), which is 2.3 times of room temperature thermal energy (26 meV), thus an exciton of the ZnO can stay stable at room temperature. However, the ZnO has a hexagonal wurtzite structure and exhibits a strong spontaneous polarization. In a ZnO-based heterostructure, a strain of a material will lead to an extremely strong piezoelectric polarization, further leading to the generation of an polarization effect in the ZnO-based heterostructure. A polarized electric field generated by the polarization induces a high concentration of an interfacial polarization charge on a ZnO heterojunction's surface, thereby modulating an energy band of the material, further affecting a plurality of performances of a structure and device related.

However, the inventors have found that, when a ZnO nanoparticle is applied as the material for the electron transport layer, surface defects of the ZnO such as hydroxyl and oxygen vacancies inevitably lead to a decrease in stability of a light-emitting diode (LED) (referring to a reproducibility of the electron transport layer or an overall performance of the LED), as well as a luminous efficiency thereof, etc.

Therefore, the current technology needs to be improved and developed.

SUMMARY

According to the defects in the prior art described above, the purpose of the present disclosure is to provide a composite material, a quantum dot light-emitting diode and a preparation method thereof, aiming to solve a problem in the prior art that, a plurality of performances decrease including the stability, the luminous efficiency, etc., of the LED having an ZnO nanoparticle being applied as the material of the electron transport layer.

The technical solution of the present application to solve the technical problems is as follows:

A preparation method for a composite material which comprises steps of:
  providing a ZnO nanoparticle and an Au source; the Au source is selected from at least one of a bulk Au or an Au particle;
  mixing the ZnO nanoparticle, the Au source, an S source with a first organic solvent, and performing a hydrothermal reaction, before obtaining the composite material.

A composite material which comprises a core and a shell formed on a surface of the core; the core material being a ZnO nanoparticle, and the shell material being ZnS and Au; wherein the shell comprises a ZnS layer and a plurality of Au atoms or Au microclusters loaded in an isolated distribution on a surface of the ZnS layer, wherein the ZnS layer is coated on the surface of the core.

A quantum dot light-emitting diode which comprises a cathode, an anode, a quantum dot light-emitting layer arranged between the cathode and the anode, and an electron transport layer arranged between the cathode and the quantum dot light-emitting layer, wherein the electron transport layer comprises the composite material prepared by the preparation method mentioned above; and/or the electron transport layer comprises the composite material mentioned above.

A preparation method for a quantum dot light-emitting diode which comprises the steps of:
  providing an anode;
  preparing a quantum dot light-emitting layer on the anode;
  preparing an electron transport layer on the quantum light-emitting layer, the electron transport layer comprising the composite material prepared by the preparation method mentioned above; and/or the electron transport layer comprising the composite material mentioned above;
  preparing a cathode on the electron transport layer; or,
  providing a cathode;
  preparing an electron transport layer on the cathode, the electron transport layer comprising the composite material prepared by the preparation method mentioned above; and/or the electron transport layer comprising the composite material mentioned above;
  preparing a quantum dot light-emitting layer on the electron transport layer;
  preparing an anode on the quantum dot light-emitting layer.

Benefits: the present application adopts a ZnO nanoparticle, a bulk Au and/or an Au particle, and an S source, to carry out a hydrothermal reaction in an organic solvent. The S source is able to vulcanize a surface of the ZnO nanoparticle to realize a formation of a ZnS layer on the surface of the ZnO nanoparticle, while an Au source can perform a thermal dissolution and diffuse into a plurality of atomic Au (that is, an Au atom or an Au microcluster) in an isolated distribution, so as to achieve a loading on a surface of the ZnS layer, and obtain a composite material taking the ZnO nanoparticle as the core material, taking the ZnS and Au as the shell material. The composite material, wherein the ZnS layer can reduce an electron capture by a surface defect of the ZnO nanoparticle, and improve a recombination efficiency of an electron and a hole in a light-emitting layer; a conductive component Au loaded on the surface of the ZnS layer has a large specific surface area, being able to construct a new electron transport channel, and improve an electron transport efficiency of an LED; therefore, the composite material of the present application is able to improve synergistically a luminous efficiency and a stability of an LED adopting the composite material.

DETAILED DESCRIPTION OF EMBODIMENTS

The present application provides a composite material, a quantum dot light-emitting diode and a preparation method thereof, in order to make the purpose, technical solution and the advantages of the present application clearer and more explicit, further detailed descriptions of the present application are stated herein, referencing to the attached drawings and some embodiments of the present application. It should be understood that the detailed embodiments of the application described here are used to explain the present application only, instead of limiting the present application.

Figure 1:
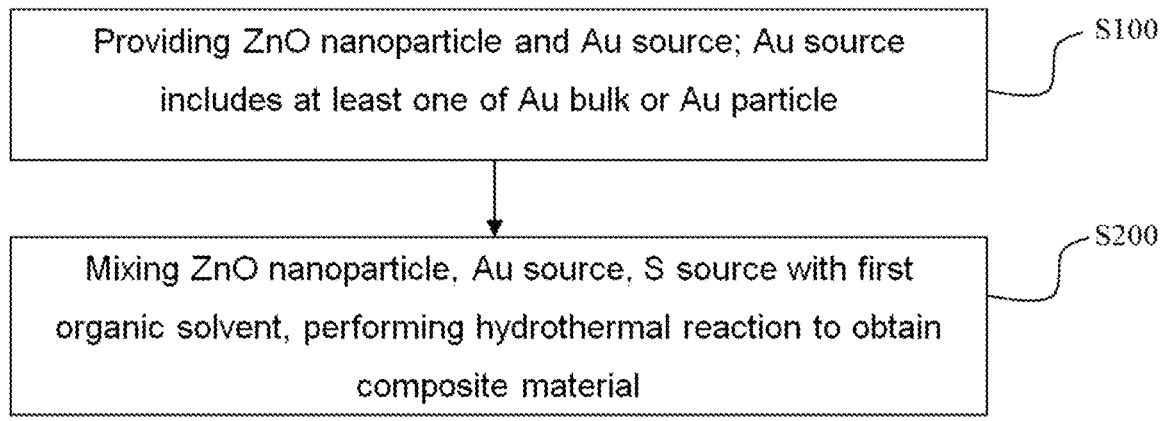
FIG. 1 illustrates a flow chart of an embodiment of a preparation method for a composite material provided by an embodiment of the present application.

Referencing to FIG. 1, an embodiment of the present application provides a preparation method for a composite material, wherein comprising the steps of:

S100, providing a ZnO nanoparticle and an Au source; the Au source includes at least one of a bulk Au or an Au particle;

S200, mixing the ZnO nanoparticle, the Au source, an S source with a first organic solvent, and performing a hydrothermal reaction, before obtaining the composite material.

Figure 2:
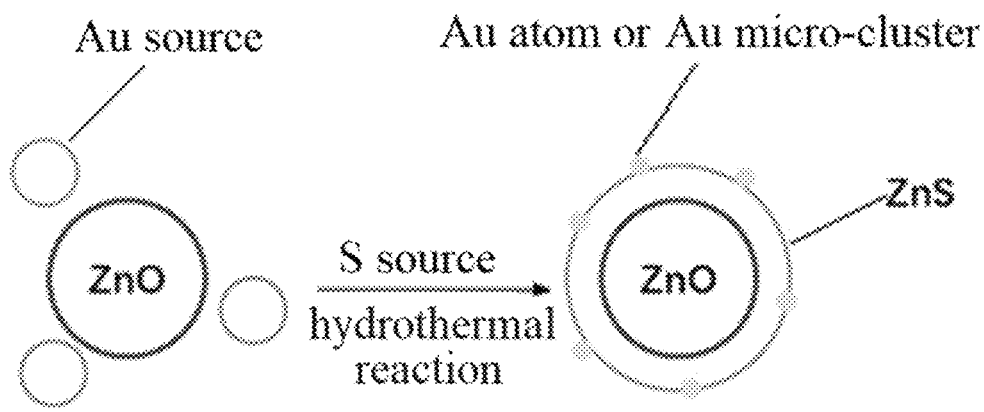
FIG. 2 illustrates a schematic diagram of a formation process of a composite material in the preparation method for the composite material provided by an embodiment of the present application.

Referencing to FIG. 2, the present embodiment adopts the ZnO nanoparticle, the bulk Au and/or the Au particle, and the S source, to carry out a hydrothermal reaction in the organic solvent. The S source is able to vulcanize a surface of the ZnO nanoparticle to realize a formation of a ZnS layer on the surface of the ZnO nanoparticle, while the Au source can perform a thermal dissolution and diffuse into a plurality of atomic Au (that is, an Au atom or an Au microcluster) in an isolated distribution, so as to achieve a loading on a surface of the ZnS layer, and obtain a composite material taking the ZnO nanoparticle as the core material, taking the ZnS and Au as the shell material. The composite material, wherein the ZnS layer in the shell is able to reduce an electron capture by a surface defect of the ZnO nanoparticle (the ZnS layer may cause a decrease in a conductivity of the composite material), and improve a recombination efficiency of an electron and a hole in a light-emitting layer. A conductive component Au loaded on the surface of the ZnS layer (being able to increase the conductivity of the composite material) has a large specific surface area, being able to enhance an interaction between the Au in the composite material and a plurality of adjacent coordinating S atoms (from the ZnS layer) (wherein the Au atom is loaded onto the surface of the ZnS layer by an electrostatic force of +Au . . . −S bonding), causing a charge redistribution around the Zn atom, thereby constructing a new electron transport channel, which further improves synergistically an electron transport efficiency of the LED (the electron transport efficiency refers to allowing more electrons to enter the light-emitting layer effectively). On one hand, it is shown by an external quantum efficiency (EQE) of the LED prepared based on the composite material (used as a material for the electron transport layer); on the other hand, a reproducibility of a performance of the LED or the electron transport layer thereof is also improved based on the composite material (used as the material for the electron transport layer). Therefore, the composite material disclosed by the present application is able to improve synergistically both the luminous efficiency and the stability of the LED.

Similar to the ZnO, the ZnS is also a semiconductor material in group II-VI with a direct wide band gap, which has two different structures: sphalerite structure and wurtzite structure, having a band gap of 3.66 eV (greater than the ZnO) at room temperature, together with a stable chemical property, a rich resource and a low price; also, having a higher electron mobility than $TiO_2$ (100-150 $cm^2 \cdot V^{-1} \cdot s^{-1}$). During a process of the hydrothermal reaction, a surface of a ZnO microsphere (that is, a ZnO nanoparticle) is separated slowly, releasing $Zn^{2+}$ and $O^{2-}$ in a solution, while the $Zn^{2+}$ will combine with $S^{2-}$ in the solution (the $S^{2-}$ is generated by the S source), forming a core on the surface of the ZnO microsphere and growing continuously, until a ZnS layer is coated on the surface of the ZnO microsphere; and at a same time, by performing a high-temperature treatment, the Au source is thermally dissolved and diffused gradually before the Au atom or the Au microcluster in an isolated distribution is loaded on the surface of the ZnS layer. The present embodiment, by vulcanizing the surface of the ZnO nanoparticle and preparing the in situ ZnS to coat the ZnO nanoparticles having a band gap relatively narrow (the band width is 3.37 eV) before forming a ZnS layer, is able to reduce a plurality of surface defects of the ZnO nanoparticles, so as to mitigate a lattice mismatch, and improve a recombination efficiency of an electron-hole in the light-emitting layer of the LED; while using a conductive component Au to load the ZnS layer to improve an electron injection effect during the ZnO forming the electron transport layer, so as to improve both the electron transport efficiency and the stability of the electron transport layer synergistically.

In one embodiment, a temperature for the hydrothermal reaction is 300-350° C.; and/or a molar ratio of the ZnO nanoparticles to the Au source and the S source is 1:0.1-0.5:0.01-0.1.

Further in an embodiment, the hydrothermal reaction time is 1-3 h.

In an embodiment, the S source may be selected from, but not limited to, at least one of sodium sulfide, thiourea, thioacetamide, or L-cysteine; and/or the first organic solvent may comprise, but not limited to, oleylamine and octadecene.

In an embodiment, a preparation method for the ZnO nanoparticle comprises the steps of: adding alkaline solution into a dispersion of a zinc salt to form a transparent solution, and carrying out a purification treatment to obtain the ZnO nanoparticle.

Further in an embodiment, the purification treatment comprises the steps of: precipitating the ZnO nanoparticle with a poor solvent (such as acetone), and collecting after centrifugation. Further in one embodiment, the ZnO nanoparticle has a particle size of 10-20 nm.

Further in an embodiment, the zinc salt may be selected from, but not limited to, at least one of zinc chloride, zinc nitrate, zinc acetate, zinc sulfate, or zinc acetate dihydrate; and/or the alkaline solution is obtained by dissolving an alkali in an alcohol solvent (such as an ethanol), and the alkali in the alkaline solution may be selected from, but not limited to, at least one of potassium hydroxide, sodium hydroxide, ammonia water, or tetramethylammonium hydroxide;

Further in an embodiment, the dispersion of the zinc salt is formed by dissolving the zinc salt in a second organic solvent, and the second organic solvent may be selected from, but not limited to, at least one of dimethyl sulfoxide (DMSO) or N, N-dimethylformamide (DMF).

Further in an embodiment, a molar ratio of the zinc salt to the $OH^-$ in the alkaline solution is 1:1.5 to 3; the alkaline solution is an ethanol solution of the alkali; and after adding the ethanol solution of the alkali, a pH of a reaction system is equal to 12 to 14.

In one embodiment, a preparation method for the Au source comprises a step of: mixing chloroauric acid with a first organic solvent to perform a redox reaction and obtain the Au source.

Further in an embodiment, a temperature for mixing the chloroauric acid with the first organic solvent is 100-150° C.; and/or a time for mixing the chloroauric acid with the first organic solvent is 1-2 h; further in an embodiment, a temperature for the redox reaction is 300-350° C.; and/or the redox reaction time is 1-2 h.

In an embodiment, after the hydrothermal reaction, and before obtaining the composite material, the method further comprises a step of: performing a purification treatment.

Further in an embodiment, a method for the purification treatment is centrifugal separation or filtration.

An embodiment of the present application provides a composite material, wherein comprising: a core and a shell formed on a surface of the core; the core material is a ZnO nanoparticle, and the shell material is ZnS and Au; wherein the shell comprises a ZnS layer and a plurality of Au atoms or Au microclusters in an isolated distribution loaded on a surface of the ZnS layer, wherein the ZnS layer is coated on the surface of the core.

In an embodiment, an particle size of the composite material is 15-40 nm. Further in an embodiment, the particle size of the composite material is 20-40 nm.

The present embodiment, wherein the composite material is able to enhance the electron transport effect of the ZnO when forming the electron transport layer, and improve a recombination efficiency of the electron-hole in the light-emitting layer of the light-emitting diode having the composite material; so as to improve the electron transport efficiency in the light-emitting diode having the composite material.

An embodiment of the present application provides a quantum dot light-emitting diode, wherein comprising a cathode, an anode, a quantum dot light-emitting layer arranged between the cathode and the anode, and an electron transport layer arranged between the cathode and the quantum dot light-emitting layer, wherein the electron transport layer comprising the composite material prepared by any one of the preparation methods mentioned above; and/or the electron transport layer comprising any one of the composite material mentioned above.

Figure 3:
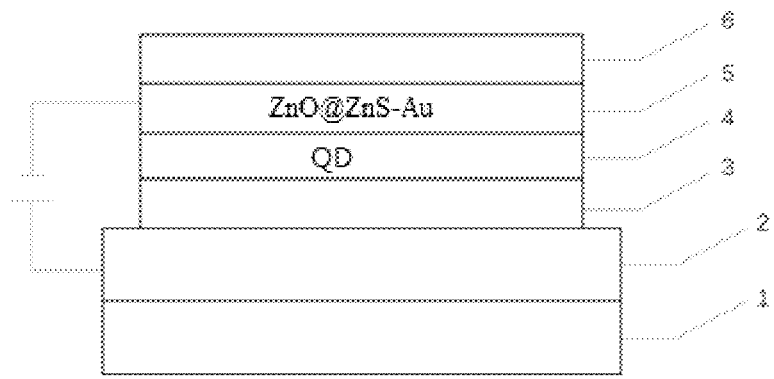
FIG. 3 illustrates a structural schematic diagram of a quantum dot light-emitting diode with a normal structure provided by an embodiment of the present application.

In the embodiment, the quantum dot light-emitting diode may have a normal structure or a flip-chip structure; an electron injection layer can be arranged between the cathode and the electron transport layer; at least one layer of a hole transport layer and a hole injection layer can be arranged between the light-emitting layer and the anode, when both the hole transport layer and the hole injection layer are arranged, the hole transport layer is arranged on a side close to the quantum dot light-emitting layer, and the hole injection layer is arranged on a side close to the anode. In an embodiment, a quantum dot light-emitting diode with a normal structure is shown in FIG. 3, an OLED device comprises, from bottom to top, a substrate 1, an anode 2 (with a thickness of 100-150 nm), a hole transport layer 3 (with a thickness of 20-60 nm), a quantum dot light-emitting layer 4 (with a thickness of 20-60 nm), an electron transport layer 5 (with a thickness of 20-60 nm), a cathode 6 (with a thickness of 30-80 nm), wherein a material of the electron transport layer 5 is a composite material described above.

Further in an embodiment, a material of the anode is selected from a plurality of doped metal oxides; wherein the doped metal oxides comprise, but not limited to, one or more of indium-doped tin oxide (ITO), fluorine-doped tin oxide (FTO), antimony-doped tin oxide (ATO), aluminum-doped zinc oxide (AZO), gallium-doped zinc oxide (GZO), indium-doped zinc oxide (IZO), magnesium-doped zinc oxide (MZO), aluminum-doped magnesium oxide (AMO).

Further in an embodiment, a material of the hole injection layer is a material having a good hole injection performance, for instance, it may be selected from, but not limited to, one or more of poly(3,4-ethylenedioxythiophene)-polystyrene-sulfonic acid (PEDOT:PSS), phthalocyanine Copper (CuPc), 2,3,5,6-tetrafluoro-7,7',8,8'-tetracyanoquinone-dimethane (F4-TCNQ), 2,3,6,7,10,11-hexacyano-1,4,5,8,9,12-hexaazatriphenylene (HATCN), a transition metal oxide, or a transition metal chalcogenide; wherein the transition metal oxide may be selected from one or more of $NiO_x$, $MoO_x$, $WO_x$, $CrO_x$, or CuO; the metal chalcogenide may be selected from one or more of $MoS_x$, $MoSe_x$, $WS_x$, $WSe_x$, or CuS.

Further in an embodiment, the hole transport layer may be prepared by a conventional hole transport material in the art, comprising but not limited to, poly(9,9-dioctylfluorene-CO—N-(4-butylene)phenyl)diphenylamine) (TFB), polyvinylcarbazole (PVK), poly(N, N' bis(4-butylphenyl)-N,N'-bis (phenyl)benzidine) (Poly-TPD), poly(9,9-dioctylfluorene-co-bis-N,N-phenyl-1,4-phenylenediamine) (PFB), 4,4',4"-tris(carbohydrate) oxazol-9-yl)triphenylamine (TCTA), poly (3,4-ethylenedioxythiophene)-polystyrenesulfonic acid (PEDOT:PSS), 4,4'-bis(9-carbazole) biphenyl (CBP), or any combinations thereof, and other organic materials having a good hole-transporting ability.

Further in an embodiment, a material of the quantum dot light-emitting layer can be selected from at least one quantum dot in red, green, or blue; in an embodiment, it may be at least one of a plurality of core-shell quantum dots, including CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, or any combinations thereof. In an embodiment, it is a blue quantum dot with the core-shell structure $Cd_xZn_{1-x}S@ZnS$ (0<x≤1); the quantum dot light-emitting layer formed by the material stated above has a plurality of characteristics including a wide and continuously distributed excitation spectrum, and a high stability of an emission spectrum.

Further in an embodiment, the material of the electron injection layer is an inorganic material and/or an organic material having an electron injection ability, in an embodiment, the inorganic material having the electron injection ability can be selected from one or more of a doped or undoped metal oxide, or a doped or undoped metal sulfide. Wherein the doped or undoped metal oxide may be selected from one or more of ZnO, $TiO_2$, $SnO_2$, $Ta_2O_3$, $ZrO_2$, NiO, TiLiO, ZnAlO, ZnMgO, ZnSnO, ZnLiO, or InSnO. The doped or undoped metal sulfide may be selected from one or more of CdS, ZnS, MoS, WS, or CuS.

Further in an embodiment, a material of the cathode may be selected from, but not limited to, one or more of a metal material, a carbon material, or a metal oxide. In an embodiment, the metal material may be selected from one or more of Al, Ag, Cu, Mo, Au, Ba, Ca, or Mg. In an embodiment, the carbon material may be selected from one or more of a graphite, a carbon nanotube, a graphene, or a carbon fiber. The metal oxide can be a doped or undoped metal oxide, in an embodiment, the metal oxide can be selected from one or more of ITO, FTO, ATO, AZO, GZO, IZO, MZO, or AMO; the metal oxide may also be a composite electrode with a metal sandwiched between a doped or undoped transparent metal oxide, in an embodiment, it can be selected from one or more of AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, or $TiO_2$/Al/$TiO_2$.

An embodiment of the present application provides a preparation method for a quantum dot light-emitting diode, wherein comprising the steps of:

providing an anode;

preparing a quantum dot light-emitting layer on the anode;

preparing an electron transport layer on the quantum light-emitting layer, the electron transport layer comprises the composite material prepared by any one of the preparation method mentioned above; and/or the electron transport layer comprises any one of the composite material mentioned above;

preparing a cathode on the electron transport layer; or, providing a cathode;

preparing an electron transport layer on the cathode, the electron transport layer comprises any one of the composite material prepared by the preparation method mentioned above; and/or the electron transport layer comprises any one of the composite material mentioned above;

preparing a quantum dot light-emitting layer on the electron transport layer;

preparing an anode on the quantum dot light-emitting layer.

It is noted that, when performing a packaging process to the quantum dot light-emitting diode having been obtained, the packaging process can be performed by adopting a common machine or manually. Preferably, in an environment of the packaging process, both the oxygen content and the water content are lower than 0.1 ppm to ensure a stability of a device.

Further detailed description of the present application are stated hereafter, referencing to a plurality of embodiments.

Embodiment 1, Preparation of the Composite Material

1. Adding Zinc chloride to DMF to form a solution having a total concentration of 0.5 M, adding dropwise 0.6 M NaOH ethanol solution at room temperature, stirring the solution continuously for 1.5 h to obtain a clear and transparent solution. Precipitating the ZnO nanoparticles with acetone, before collecting after centrifugation, to obtain the ZnO nanoparticles.

2. Adding 50 mg of chloroauric acid and 600 mg of the ZnO nanoparticles stated above to 20 mL of a mixed solution of oleylamine and octadecene, dispersing by ultrasonication, and stirring at 120° C. for 1 h to obtain a mixed solution; heating the mixed solution to 200° C. and holding at the temperature for 1 hour.

3. Then adding $Na_2S$ to the solution, and keeping the solution at 320° C. for 2 hours, before cooling to the room temperature. Collecting a solid by centrifugation to obtain the composite material, that is, a nanoparticle having a ZnO@ZnS—Au core-shell structure; washing with n-hexane and dispersing with an appropriate amount of ethanol, before being used for an LED preparation.

Embodiment 2, Preparation of the Composite Material

1. Adding Zinc nitrate to DMF to form a solution having a total concentration of 0.5 M, adding by dropwise 0.6 M KOH ethanol solution at room temperature, stirring the solution continuously for 1.5 h to obtain a clear and transparent solution. Precipitating with acetone, before collecting after centrifugation, to obtain the ZnO nanoparticles.

2. Adding 50 mg of chloroauric acid and 600 mg of the ZnO nanoparticles stated above to 20 mL of a mixed solution of oleylamine and octadecene, dispersing by ultrasonic, and stirring at 120° C. for 1 h to obtain a mixed solution; heating the mixed solution to 200° C. and holding at the temperature for 1 hour.

3. Then adding thioacetamide to the solution, and keeping the solution at 320° C. for 2 hours, before cooling to the room temperature. Collecting a solid by centrifugation to obtain the composite material, that is, a nanoparticle having a ZnO@ZnS—Au core-shell structure; washing with n-hexane and dispersing with an appropriate amount of ethanol, before being used for preparing a device.

Embodiment 3, Preparation of the Composite Material

1. Adding Zinc acetate to DMF to form a solution having a total concentration of 0.5 M, adding by dropwise 0.6 M tetramethylammonium hydroxide ethanol solution at room temperature, stirring the solution continuously for 1.5 h to obtain a clear and transparent solution. Precipitating the ZnO nanoparticles with acetone, before collecting after centrifugation, to obtain the ZnO nanoparticles.

2. Adding 50 mg of chloroauric acid and 600 mg of the ZnO nanoparticles stated above to 20 mL of a mixed solution of oleylamine and octadecene, dispersing by ultrasonic, and stirring at 120° C. for 1 h to obtain a mixed solution; heating the mixed solution to 200° C. and holding at the temperature for 1 hour.

3. Then adding L-cysteine to the solution, and keeping the solution at 320° C. for 2 hours, before cooling to the room temperature. Collecting a solid by centrifugation to obtain the composite material, that is, a nanoparticle having a ZnO@ZnS—Au core-shell structure; washing with n-hexane and dispersing with an appropriate amount of ethanol, before being used for preparing a device.

Embodiment 4, Preparation of a Quantum Dot Light-Emitting Diode

1. Providing an anode (an ITO conductive glass having been subjected to a pretreatment; a plurality of steps of the pretreatment includes: cleaning the ITO conductive glass with a detergent to preliminarily remove a plurality of stains on a surface, followed by an ultrasonic cleaning in deionized water, isopropanol, acetone, deionized water respectively for 20 min each in a sequence, to remove a plurality of impurities on the surface, before finally thermal annealing with a high purity nitrogen);

2. Growing a hole transport layer (TFB) on a substrate: placing the ITO conductive glass on a spin coater, and spin-coating a TFB solution having been prepared to form a film; controlling a thickness of the film by adjusting a concentration of the solution, a spin-coating speed and a spin-coating time, then performing a thermal annealing.

3. Depositing a quantum dot light-emitting layer ($Cd_xZn_{1-x}S@ZnS$, wherein $0<x\leq1$) on the hole transport layer: placing the substrate already having the hole transport layer grown on the spin coater, and spin coating a solution of the $Cd_xZn_{1-x}S@ZnS$ ($0<x\leq1$) having a certain concentration prepared before forming a film, controlling a thickness of the light-emitting layer by adjusting a concentration of the solution, a spin-coating speed and a spin-coating time, then drying out.

4. Depositing an electron transport layer on the quantum dot light-emitting layer, a material of the electron transport layer is the ZnO@ZnS—Au obtained in the embodiment 1: placing the substrate having the quantum dot light-emitting layer already deposited on a spin coater, and spin coating the solution of the ZnO@ZnS—Au into a film, controlling a thickness of the electron transport layer by adjusting a concentration of the solution, a spin-coating speed (a rotation speed between 3000-5000 rpm) and a spin-coating time, then forming a film by a thermal annealing.

5. Evaporating a cathode (Al) on the electron transport layer, and obtaining a quantum dot light-emitting diode: placing the substrate having each functional layer already deposited into an evaporation chamber and thermally evaporating a layer of aluminum as a cathode through a mask.

A structure of the quantum dot light-emitting diode prepared is ITO (150 nm)/TFB (40 nm)/$Cd_xZn_{1-x}S@ZnS$, wherein $0<x\leq1$ (40 nm)/the ZnO@ZnS—Au obtained in the embodiment 1 (30 nm)/Al (80 nm).

Embodiment 5, Preparation of a Quantum Dot Light-Emitting Diode

A preparation process is as same as that in the embodiment 4, and one only difference is that, the material of the electron transport layer adopted is the ZnO@ZnS—Au obtained in the embodiment 2, and the structure of the quantum dot light-emitting diode obtained is ITO (150 nm)/TFB (40 nm)/$Cd_xZn_{1-x}S@ZnS$, wherein $0<x\leq1$ (40 nm)/the ZnO@ZnS—Au (30 nm)/Al (80 nm) obtained in the embodiment 2.

Embodiment 6, Preparation of a Quantum Dot Light-Emitting Diode

A preparation process is the same as that in the embodiment 4, and one only difference is that, the material of the electron transport layer adopted is the ZnO@ZnS—Au obtained in the embodiment 2, and the structure of the quantum dot light-emitting diode obtained is ITO (150 nm)/TFB (40 nm)/$Cd_xZn_{1-x}S@ZnS$, wherein $0<x\leq1$ (40 nm)/the ZnO@ZnS—Au (30 nm)/Al (80 nm) obtained in the embodiment 3.

Control 1: Preparation of Another Quantum Dot Light-Emitting Diode.

A preparation process is the same as that in the embodiment 4, and one only difference is that, the material of the electron transport layer adopted is the ZnO nanoparticle obtained in the embodiment 1, and the structure of the quantum dot light-emitting diode obtained is ITO (150 nm)/TFB (40 nm)/$Cd_xZn_{1-x}S@ZnS$, wherein $0<x\leq1$ (40 nm)/the ZnO (30 nm)/Al (80 nm) obtained in the embodiment 1.

Carrying out a performance test of the quantum dot light-emitting diodes prepared by the embodiments 4-6 and the control 1, while the tested data of turn-on voltage and external quantum efficiency (EQE) of each quantum dot light-emitting diode are shown in Table 1. It can be seen that, the turn-on voltage of the quantum dot light-emitting diode prepared in the control 1 is greater than that of the quantum dot light-emitting diodes prepared in the embodiments 4-6. Meanwhile, the EQE of the quantum dot light-emitting diode prepared in the control 1 is smaller than that of the quantum dot light-emitting diode prepared in the embodiments 4-6. That shows: under a same condition, a luminous efficiency and a stability of the quantum dot light-emitting diode prepared by adopting the composite material described in the present disclosure as the material of the electron transport layer are better than that prepared with an existing ZnO as the material of the electron transport layer. This is because: introducing the ZnS layer into the composite material (the ZnS layer may lead to a decrease in the conductivity of the material) may reduce the surface defects of the ZnO (that is, reducing a trapping to the electrons by the defects), and introducing the conductive component Au can increase the electrical conductivity of the composite material, making synergistically the composite material have a good electron transport efficiency (the electron transport efficiency refers to allowing more electrons to enter the light-emitting layer effectively), which is reflected in the external quantum efficiency (EQE); while a reduction in the turn-on voltage is also due to the electrons entering into the light-emitting layer more efficiently (that is, the electron transport efficiency is improved), making a use of the electrons more efficient and requiring less energy for the light-emitting layer to emit a light.

TABLE 1

Data of the performance test to the quantum dot light-emitting diodes prepared by the embodiments 4-6 and the control 1

| Project | Turn-on voltage (V) | Luminous efficiency (EQE) (%) |
| --- | --- | --- |
| Control 1 | 4.07 | 3.20 |
| Embodiment 4 | 2.94 | 5.90 |
| Embodiment 5 | 3.16 | 5.40 |
| Embodiment 6 | 3.25 | 6.10 |

All above, the present application adopts a ZnO nanoparticle, a bulk Au and/or an Au particle, and an S source, to carry out a hydrothermal reaction in an organic solvent. The S source is able to vulcanize a surface of the ZnO nanoparticle to realize a formation of a ZnS layer on the surface of the ZnO nanoparticle, while an Au source can perform a thermal dissolution and be diffused into a plurality of atomic Au in an isolated distribution (that is, an Au atom or an Au microcluster), so as to achieve a loading on a surface of the ZnS layer, and obtain a composite material taking the ZnO nanoparticle as the core material, taking the ZnS and Au as the shell material; the ZnS layer in the shell can reduce capturing an electron by a surface defect of the ZnO nanoparticle, and improve a recombination efficiency of an electron and a hole in a light-emitting layer; a conductive component Au atom or the Au microcluster loaded on the surface of the ZnS layer has a large specific surface area, being able to construct a new electron transport channel, and improve an electron transport efficiency of an LED; therefore, the composite material of the present application is able to improve synergistically a luminous efficiency and a stability of an LED adopting the composite material.

It should be understood that, the application of the present application is not limited to the above examples listed. Ordinary technical personnel in this field can improve or change the applications according to the above descriptions, all of these improvements and transforms should belong to the scope of protection in the appended claims of the present application.

What is claimed is:

1. A preparation method for a composite material, comprising:
providing a ZnO nanoparticle and an Au source, and the Au source includes at least one of a bulk Au or an Au particle; and
mixing the ZnO nanoparticle, the Au source, and an S source with a first organic solvent, and performing a hydrothermal reaction, before obtaining the composite material.

2. The preparation method according to claim 1, wherein a temperature for the hydrothermal reaction is 300-350° C.; and/or
a molar ratio of the ZnO nanoparticles to the Au source and the S source is 1:0.1-0.5:0.01-0.1.

3. The preparation method according to claim 1, wherein the S source includes at least one of sodium sulfide, thiourea, thioacetamide, or L-cysteine; and/or
the first organic solvent comprises oleylamine and octadecene.

4. The preparation method according to claim 1, wherein a preparation method for the ZnO nanoparticle comprises: adding alkaline solution into a dispersion of a zinc salt to form a transparent solution, and carrying out a purification treatment to obtain the ZnO nanoparticle.

5. The preparation method according to claim 4, wherein the zinc salt includes at least one of zinc chloride, zinc nitrate, zinc acetate, zinc sulfate, or zinc acetate dihydrate; and/or
the alkali in the alkaline solution includes at least one of potassium hydroxide, sodium hydroxide, ammonia water, or tetramethylammonium hydroxide; and/or
a molar ratio of the zinc salt to the $OH^-$ in the alkaline solution is 1:1.5 to 3.

6. The preparation method according to claim 4, wherein the dispersion of the zinc salt is formed by dissolving the zinc salt in a second organic solvent, the second organic solvent includes at least one of dimethyl sulfoxide or N,N-dimethylformamide.

7. The preparation method according to claim 1, wherein a preparation method for the Au source comprises: mixing chloroauric acid with a first organic solvent to perform a redox reaction and obtain the Au source.

8. The preparation method according to claim 7, wherein a temperature for mixing the chloroauric acid with the first organic solvent is 100-150° C.; and/or
a time for mixing the chloroauric acid with the first organic solvent is 1-2 h.

9. The preparation method according to claim 7, wherein a temperature for the redox reaction is 300-350° C.; and/or the redox reaction time is 1-2 h.

10. The preparation method according to claim 1, wherein the hydrothermal reaction time is 1-3 h.

11. A composite material, comprising: a core and a shell formed on a surface of the core; the core material is a ZnO nanoparticle, the shell material is ZnS and Au; wherein the shell comprises a ZnS layer and a plurality of Au atoms or Au microclusters loaded on a surface of the ZnS layer and in an isolated distribution, while the ZnS layer is coated on a surface of the core.

12. The composite material according to claim 11, wherein a particle size of the composite material is 15-40 nm.

13. The composite material according to claim 12, wherein the particle size of the composite material is 20-40 nm.

14. The composite material according to claim 11, wherein the composite material is composed by the core and the shell formed on the surface of the core.

15. A quantum dot light-emitting diode, comprising: a cathode, an anode, a quantum dot light-emitting layer arranged between the cathode and the anode, and an electron transport layer arranged between the cathode and the quantum dot light-emitting layer, wherein the electron transport layer comprises a composite material prepared by a preparation method comprising:
providing a ZnO nanoparticle and an Au source; the Au source includes at least one of a bulk Au or an Au particle;
mixing the ZnO nanoparticle, the Au source, and an S source with a first organic solvent, and performing a hydrothermal reaction, before obtaining the composite material; and/or the electron transport layer comprises a composite material comprising: a core and a shell formed on a surface of the core; the core material is a ZnO nanoparticle, the shell material is ZnS and Au; wherein the shell comprises a ZnS layer and a plurality of Au atoms or Au microclusters loaded on a surface of the ZnS layer and in an isolated distribution, while the ZnS layer is coated on a surface of the core.

16. The quantum dot light-emitting diode according to claim 15, wherein the electron transport layer is the composite material prepared by the preparation method comprising:
providing a ZnO nanoparticle and an Au source; the Au source includes at least one of a bulk Au or an Au particle; and
mixing the ZnO nanoparticle, the Au source, an S source with a first organic solvent, and performing a hydrothermal reaction, before obtaining the composite material; and/or the electron transport layer is the composite material comprising: a core and a shell formed on a surface of the core; the core material is a ZnO nanoparticle, the shell material is ZnS and Au; wherein the shell comprises a ZnS layer and a plurality of Au atoms or Au microclusters loaded on a surface of the ZnS layer and in an isolated distribution, while the ZnS layer is coated on a surface of the core.

17. The quantum dot light-emitting diode according to claim 15, wherein the quantum dot light-emitting diode further comprises at least one layer of a hole transport layer and a hole injection layer arranged between the light-emitting layer and the anode, when arranging both the hole transport layer and the hole injection layer, the hole transport layer is arranged on a side close to the quantum dot light-emitting layer, and the hole injection layer is arranged on a side close to the anode.

18. The quantum dot light-emitting diode according to claim 15, wherein a thickness of the electron transport layer is 20-60 nm.

19. A preparation method for a quantum dot light-emitting diode, comprising:

providing an anode;
preparing a quantum dot light-emitting layer on the anode;
preparing an electron transport layer on the quantum light-emitting layer, the electron transport layer comprising a composite material prepared by a preparation method comprising:
providing a ZnO nanoparticle and an Au source, and the Au source includes at least one of a bulk Au or an Au particle;
mixing the ZnO nanoparticle, the Au source, and an S source with a first organic solvent, and performing a hydrothermal reaction, before obtaining the composite material; and/or the electron transport layer comprising a composite material comprising: a core and a shell formed on a surface of the core; the core material is a ZnO nanoparticle, the shell material is ZnS and Au; wherein the shell comprises a ZnS layer and a plurality of Au atoms or Au microclusters loaded on a surface of the ZnS layer and in an isolated distribution, while the ZnS layer is coated on a surface of the core;
preparing a cathode on the electron transport layer; or
providing a cathode;
preparing an electron transport layer on the cathode, the electron transport layer comprising the composite material prepared by the preparation method comprising:
providing a ZnO nanoparticle and an Au source; the Au source includes at least one of a bulk Au or an Au particle;
mixing the ZnO nanoparticle, the Au source, an S source with a first organic solvent, and performing a hydrothermal reaction, before obtaining the composite material; and/or the electron transport layer comprising the composite material comprising: a core and a shell formed on a surface of the core; the core material is a ZnO nanoparticle, the shell material is ZnS and Au; wherein the shell comprises a ZnS layer and a plurality of Au atoms or Au microclusters loaded on a surface of the ZnS layer and in an isolated distribution, while the ZnS layer is coated on a surface of the core;
preparing a quantum dot light-emitting layer on the electron transport layer; and
preparing an anode on the quantum dot light-emitting layer.

20. The preparation method according to claim 19, wherein the electron transport layer is the composite material prepared by a preparation method comprising:
providing a ZnO nanoparticle and an Au source; the Au source includes at least one of a bulk Au or an Au particle;
mixing the ZnO nanoparticle, the Au source, and an S source with a first organic solvent, and performing a hydrothermal reaction, before obtaining the composite material; and/or the electron transport layer is the composite material comprising: a core and a shell formed on a surface of the core; the core material is a ZnO nanoparticle, the shell material is ZnS and Au; wherein the shell comprises a ZnS layer and a plurality of Au atoms or Au microclusters loaded on a surface of the ZnS layer and in an isolated distribution, while the ZnS layer is coated on a surface of the core.

* * * * *